(12) United States Patent
Xu (10) Patent No.: US 9,551,912 B2
(45) Date of Patent: Jan. 24, 2017

(54) HIGH QUALITY LIQUID CRYSTAL DISPLAY PIXEL CIRCUIT

(71) Applicant: Shenzhen China Star Optoelectronics Technology Co., Ltd., Shenzhen (CN)

(72) Inventor: Hongyuan Xu, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 0 days.

(21) Appl. No.: 14/771,500

(22) PCT Filed: Jun. 25, 2015

(86) PCT No.: PCT/CN2015/082264
§ 371 (c)(1),
(2) Date: Aug. 30, 2015

(87) PCT Pub. No.: WO2016/187921
PCT Pub. Date: Dec. 1, 2016

(65) Prior Publication Data
US 2016/0349548 A1    Dec. 1, 2016

(30) Foreign Application Priority Data

May 25, 2015 (CN) .......................... 2015 1 0271833

(51) Int. Cl.
*G09G 3/36* (2006.01)
*G02F 1/137* (2006.01)
(Continued)

(52) U.S. Cl.
CPC ............. *G02F 1/137* (2013.01); *G02F 1/1368* (2013.01); *G02F 1/13439* (2013.01);
(Continued)

(58) Field of Classification Search
CPC ........................... G09G 3/3607; G09G 3/3611
See application file for complete search history.

(56) References Cited

U.S. PATENT DOCUMENTS

9,183,802 B2 * 11/2015 Tang ..................... G09G 3/3648
9,268,184 B2 *  2/2016 Xu ..................... G02F 1/136213
(Continued)

*Primary Examiner* — Evan Pert
(74) *Attorney, Agent, or Firm* — Leong C. Lei (57) ABSTRACT

The present invention provides a high quality liquid crystal display pixel circuit, and a plurality of sub pixels arranged in array, and each sub pixel is divided into a main area (Main) and a sub area (Sub), and one data signal line, a voltage dividing unit (10) and a routing are provided in accordance with sub pixels of each column; a Nth data line (D(N)) is electrically coupled to the main areas (Main) of the sub pixels of Nth column and provides a main data signal voltage to the same, and the corresponding Nth routing (L(N)) is led out from the voltage dividing unit (10), and is electrically coupled to the sub areas (Sub) of the sub pixels of the next column, N+1 column and provides a sub data signal voltage acquired by performing voltage dividing to the main data signal voltage with the voltage dividing unit (10) to the same; polarities of the main data signal voltage provided by the Nth data signal line (D(N)) and the main data signal voltage provided by the next N+1th data signal line (D(N+1)) are opposite. The pixel circuit can diminish the color shift to reduce the flicker of the liquid crystal display panel and promote the display quality.

14 Claims, 4 Drawing Sheets (51) Int. Cl.
  *G02F 1/1362* (2006.01)
  *G02F 1/1343* (2006.01)
  *G02F 1/1368* (2006.01)
  *H01L 27/12* (2006.01)

(52) U.S. Cl.
  CPC .. *G02F 1/134336* (2013.01); *G02F 1/136286* (2013.01); *G09G 3/3607* (2013.01); *G09G 3/3611* (2013.01); *H01L 27/124* (2013.01); *H01L 27/1255* (2013.01); *G02F 2001/134345* (2013.01); *G02F 2201/121* (2013.01); *G02F 2201/123* (2013.01)

(56) References Cited

U.S. PATENT DOCUMENTS

| | | | |
|---|---|---|---|
| 2010/0253866 A1* | 10/2010 | Lan | G02F 1/13624 349/38 |
| 2011/0267325 A1* | 11/2011 | Xi | G09G 3/3648 345/211 |
| 2015/0179115 A1* | 6/2015 | Fan | G09G 3/3614 345/209 |
| 2016/0085122 A1* | 3/2016 | Nishihara | G02F 1/134336 349/37 |
| 2016/0246146 A1* | 8/2016 | Yao | G02F 1/1362 |
| 2016/0247467 A1* | 8/2016 | Wang | H04N 13/00 |

* cited by examiner

HIGH QUALITY LIQUID CRYSTAL DISPLAY PIXEL CIRCUIT

FIELD OF THE INVENTION

The present invention relates to a display technology field, and more particularly to a high quality liquid crystal display pixel circuit.

BACKGROUND OF THE INVENTION

The Liquid Crystal Display (LCD) possesses advantages of thin body, power saving and no radiation to be widely used in many application scope. Such as LCD TV, mobile phone, personal digital assistant (PDA), digital camera, notebook, laptop, and dominates the flat panel display field.

Most of the liquid crystal displays on the present market are back light type liquid crystal displays, which comprise a shell, a liquid crystal display panel located in the shell and a backlight module located in the shell. The liquid crystal display panel is a major component of the liquid crystal display. However, the liquid crystal display panel itself does not emit light and needs the back light module to provide light source for normally showing images.

Generally, the liquid crystal display panel comprises a Color Filter (CF), a Thin Film Transistor Array Substrate (TFT Array Substrate) and a Liquid Crystal Layer positioned between the two substrates. Meanwhile, pixel electrodes, common electrodes are provided respectively at relative inner sides of the two substrates. The light of back light module is reflected to generate images by applying voltages to control the liquid crystal molecules to be changed directions.

The liquid crystal displays have kinds of display types, including Twisted Nematic (TN) type, Electrically Controlled Birefringence (ECB) type, Vertical Alignment (VA) type and et cetera. The VA type is a common display type with benefits of high contrast, wide view angle and rubbing alignment free. However, because the VA type utilizes vertical twist liquid crystals and the birefraction difference of the liquid crystal molecules is larger, the issue of the color shift under large view angle is more serious.

Reducing the color shift is the requirement for the development of the VA type liquid crystal displays. At present, the mainstream method of solving the color shift of the VA type liquid crystal displays is multi domain, such as a pixel design of 8 domain display. The twisted angles of the liquid crystal molecules of the 4 domains in the main area (main) and the 4 domains in the sub area (sub) in the same sub pixel are different to improve the color shift. The color shift improvement skill mainly comprises capacitor coupling (CC) technology, charge sharing (CS) technology, common electrode voltage (Vcom) modulation technology, 2D1G/2G1D technology. However, lots of color shift improvement technologies makes the liquid crystal twist polarities of the main area and the sub area in one sub pixel are the same, and cannot achieve that the main area and sub area in one sub pixel shows opposite polarities in one frame of an image, which results in that the flicker of the liquid crystal display panel is more obvious to reduce the display quality. Although 2D1G color shift improvement technology can solve the issue of panel flicker, it requires to double the amount of the data signal lines, and the amount of the Chip on Films (COF) is also required to be doubled, too. The panel cost will increase.

Figure 1:
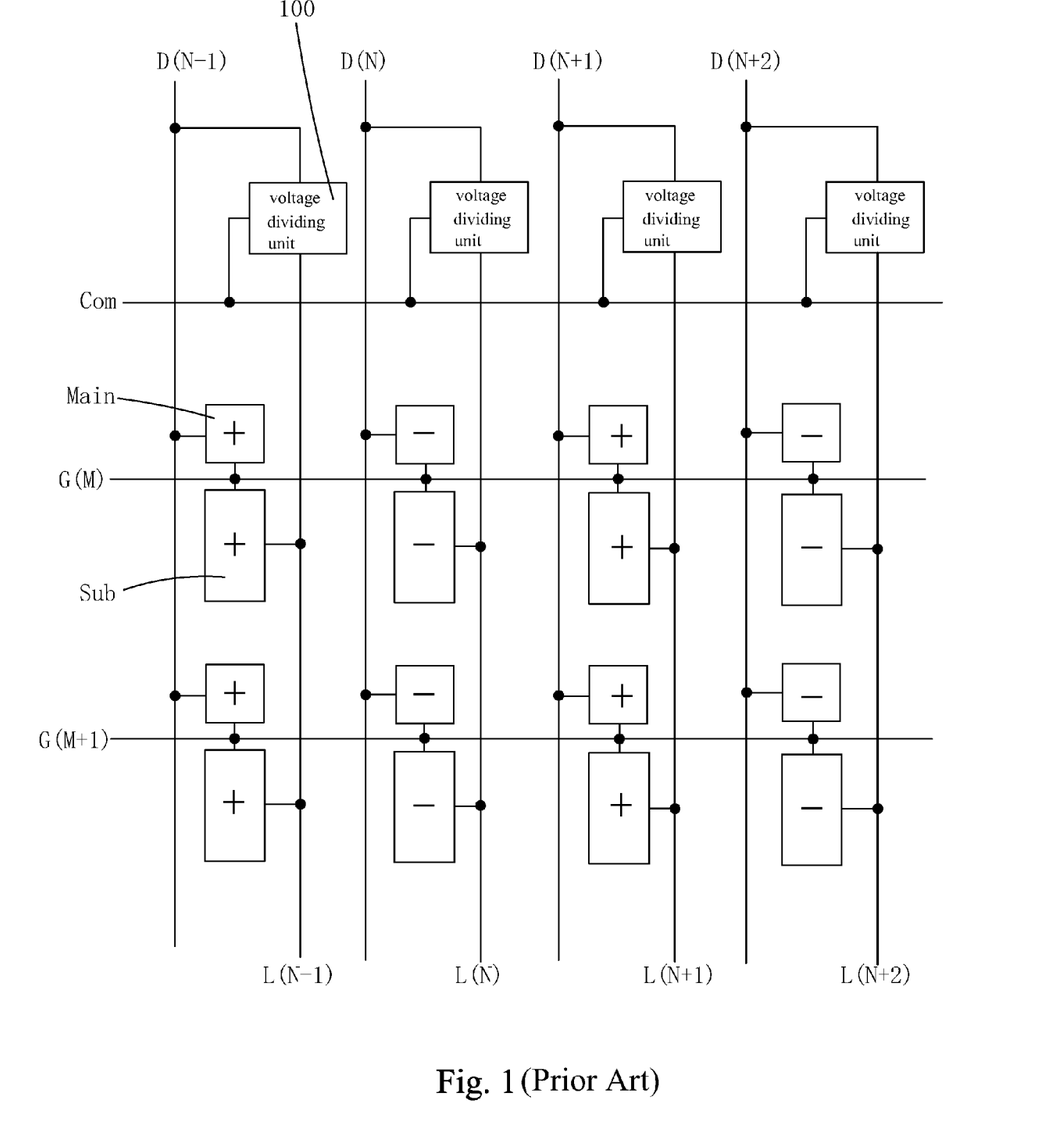
FIG. 1 is an overall structure diagram of a pixel circuit for improving the color shift issue of a VA type liquid crystal display.
Figure 2:
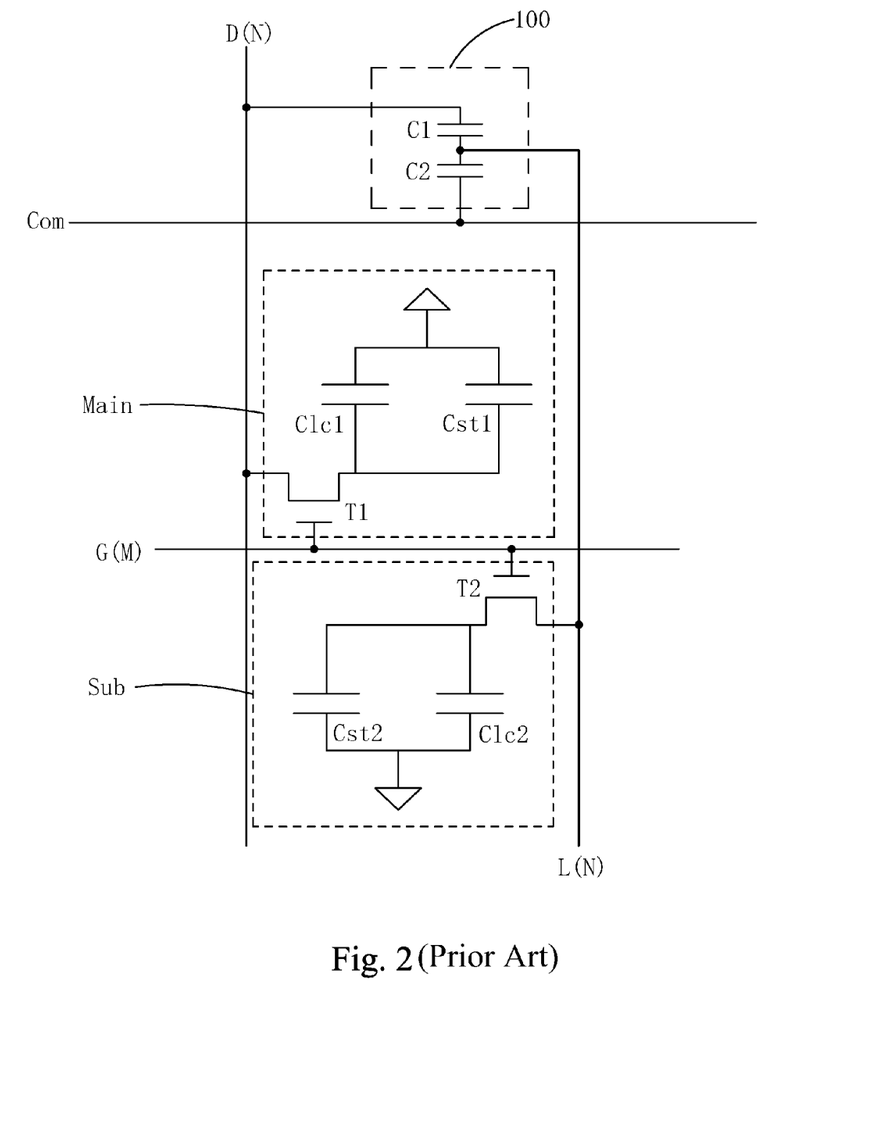
FIG. 2 is a specific circuit diagram in accordance with FIG. 1.

FIG. 1 shows an overall structure diagram of a pixel circuit for improving the color shift issue of a VA type liquid crystal display, and FIG. 2 is a specific circuit diagram in accordance with FIG. 1. With combination of FIG. 1 and FIG. 2, a plurality of sub pixels arranged in array, and each sub pixel is divided into a main area Main and a sub area Sub; one scan line is provided in accordance with to sub pixels of each row, and one data signal line, a voltage dividing unit 100 and a wiring are provided in accordance with sub pixels of each column. M, N are set to be positive integers, and a Mth scan line G(M) is electrically coupled to the main area Main and the sub area Sub of the sub pixels of Mth row at the same time and provides a scan signal to the same; a Nth data line D(N) is electrically coupled to the main area Main of the sub pixels of Nth column and provides a main data signal voltage to the same, and the Nth data line D(N) is electrically coupled to the common electrode Com via the voltage dividing unit 100, and the corresponding Nth routing L(N) is led out from the voltage dividing unit 100, and is electrically coupled to the sub areas Sub of the sub pixels of the N column and provides a sub data signal voltage which is different from the main data signal voltage to the same.

Specifically, the voltage dividing unit 100 comprises a first capacitor C1 and a second capacitor C2 coupled in series, and one end of the first capacitor C1 is electrically coupled to the data signal line, and the other end is electrically coupled to one end of the second capacitor C2, and the other end of the second capacitor C2 is electrically coupled to a common electrode line Com. The Nth routing L(N) is led out between the first capacitor C1 and the second capacitor C2, and with voltage dividing function of the first capacitor C1 and the second capacitor C2, the sub data signal voltage is closer to the common electrode voltage than the main data signal voltage, i.e. the voltage difference of the sub data signal voltage and the common electrode voltage is definitely smaller than the voltage difference of the main data signal voltage and the common electrode voltage. With applying different voltages to the main area Main and the sub area Sub in one pixel, the objective of improving the color shift can be achieved.

The aforesaid pixel circuit according to prior art can solve the color shift issue of VA type liquid crystal display but the polarities of the main data signal voltage and the sub data signal voltage provided by the Nth data line D(N) corresponding to the sub pixels of Nth column and the corresponding Nth routing L(N) are the same. Therefore, in the image of the same frame, the polarities of the voltages applied to the main area Main and the sub area Sub in one pixel are the same, which remains to make that the flicker of the liquid crystal display panel is more obvious to reduce the display quality.

SUMMARY OF THE INVENTION

An objective of the present invention is to provide a high quality liquid crystal display pixel circuit, capable of reducing the color shift issue of VA type liquid crystal display under the premise without increasing the amounts of the data signal lines and the COF ends, and meanwhile, capable of achieving that the main area and sub area in one sub pixel shows opposite polarities in one frame of an image to reduce the flicker of the liquid crystal display panel and promote the display quality.

For realizing the aforesaid objective, the present invention provides a high quality liquid crystal display pixel circuit, and a plurality of sub pixels arranged in array, and each sub pixel is divided into a main area and a sub area; one scan line is provided in accordance with to sub pixels of each row, and one data signal line, a voltage dividing unit and a routing are provided in accordance with sub pixels of each column;

M, N are set to be positive integers, and a Mth scan line is electrically coupled to the main area and the sub area of the sub pixels of Mth row at the same time and provides a scan signal to the same; a Nth data line is electrically coupled to the main areas of the sub pixels of Nth column and provides a main data signal voltage to the same, and the Nth data line is electrically coupled to the common electrode via the voltage dividing unit, and the corresponding Nth routing is led out from the voltage dividing unit, and is electrically coupled to the sub areas of the sub pixels of the next column, N−1 column and provides a sub data signal voltage acquired by performing voltage dividing to the main data signal voltage with the voltage dividing unit to the same;

polarities of the main data signal voltage provided by the Nth data signal line and the main data signal voltage provided by the next N+1th data signal line are opposite.

The voltage dividing unit comprises a first capacitor and a second capacitor coupled in series, and one end of the first capacitor is electrically coupled to the data signal line, and the other end is electrically coupled to one end of the second capacitor; the other end of the second capacitor is electrically coupled to a common electrode line; the routing is led out between the first capacitor and the second capacitor.

The main area comprises a first thin film transistor, a first liquid crystal capacitor and a first storage capacitor; the sub area comprises a second thin film transistor, a second liquid crystal capacitor and a second storage capacitor;

for the sub pixel of Mth row, Nth column, a gate of the first thin film transistor is electrically coupled to the Mth scan line, and a source is electrically coupled to the Nth data signal line; after the first liquid crystal capacitor and the first storage capacitor are coupled in parallel, one end is electrically coupled to a drain of the first thin film transistor and the other end is electrically coupled to a constant voltage; a gate of the second thin film transistor is electrically coupled to the Mth scan line, and a source is electrically coupled to the N−1th routing corresponding to the sub pixels of previous N−1th column; after the second liquid crystal capacitor and the second storage capacitor are coupled in parallel, one end is electrically coupled to a drain of the second thin film transistor and the other end is electrically coupled to a constant voltage;

for the sub pixel of Mth row, N+1th column, a source of the first thin film transistor is electrically coupled to the N+1th data signal line; a source of the second thin film transistor is electrically coupled to the Nth routing corresponding to the pixels of Nth column.

The main area and the sub area respectively comprise four domains.

The Nth data signal line provides the main data signal voltage to the four domains in the main areas of the sub pixels of Nth column, and the Nth routing provides the sub data signal voltage to the four domains in the sub areas of the sub pixels of the next N+1th column; with voltage dividing function of the first capacitor and the second capacitor, the relationship of the main data signal voltage and the sub data signal voltage is:

$$V\text{sub}=(C1/(C1+C2))\times(V\text{main}-V\text{com})+V\text{com}$$

wherein Vsub represents the sub data signal voltage, and Vmain represents the main data signal voltage, and C1 represents the first capacitor, and C2 represents the second capacitor, and Vcom represents the common electrode voltage.

The first capacitor and the second capacitor are formed by a second metal layer and a first metal layer.

The first capacitor and the second capacitor are formed by an ITO pixel electrode and a first metal layer.

Sizes of the first capacitor and the second capacitor are respectively determined by areas of the first capacitor and the second capacitor.

A difference between the main data signal voltage and the sub data signal voltage alters by changing areas of the first capacitor and the second capacitor.

The present invention further provides a high quality liquid crystal display pixel circuit, and a plurality of sub pixels arranged in array, and each sub pixel is divided into a main area and a sub area; one scan line is provided in accordance with to sub pixels of each row, and one data signal line, a voltage dividing unit and a routing are provided in accordance with sub pixels of each column;

M, N are set to be positive integers, and a Mth scan line is electrically coupled to the main area and the sub area of the sub pixels of Mth row at the same time and provides a scan signal to the same; a Nth data line is electrically coupled to the main areas of the sub pixels of Nth column and provides a main data signal voltage to the same, and the Nth data line is electrically coupled to the common electrode via the voltage dividing unit, and the corresponding Nth routing is led out from the voltage dividing unit, and is electrically coupled to the sub areas of the sub pixels of the next column, N−1 column and provides a sub data signal voltage acquired by performing voltage dividing to the main data signal voltage with the voltage dividing unit to the same;

polarities of the main data signal voltage provided by the Nth data signal line and the main data signal voltage provided by the next N+1th data signal line are opposite;

wherein the voltage dividing unit comprises a first capacitor and a second capacitor coupled in series, and one end of the first capacitor is electrically coupled to the data signal line, and the other end is electrically coupled to one end of the second capacitor; the other end of the second capacitor is electrically coupled to a common electrode line; the routing is led out between the first capacitor and the second capacitor;

wherein the main area comprises a first thin film transistor, a first liquid crystal capacitor and a first storage capacitor; the sub area comprises a second thin film transistor, a second liquid crystal capacitor and a second storage capacitor;

for the sub pixel of Mth row, Nth column, a gate of the first thin film transistor is electrically coupled to the Mth scan line, and a source is electrically coupled to the Nth data signal line; after the first liquid crystal capacitor and the first storage capacitor are coupled in parallel, one end is electrically coupled to a drain of the first thin film transistor and the other end is electrically coupled to a constant voltage; a gate of the second thin film transistor is electrically coupled to the Mth scan line, and a source is electrically coupled to the N−1th routing corresponding to the sub pixels of previous N−1th column; after the second liquid crystal capacitor and the second storage capacitor are coupled in parallel, one end is electrically coupled to a drain of the second thin film transistor and the other end is electrically coupled to a constant voltage;

for the sub pixel of Mth row, N+1th column, a source of the first thin film transistor is electrically coupled to the N+1th data signal line; a source of the second thin film transistor is electrically coupled to the Nth routing corresponding to the pixels of Nth column;

wherein the first capacitor and the second capacitor are formed by a second metal layer and a first metal layer.

The benefits of the present invention are: the present invention provides a high quality liquid crystal display pixel circuit. The Nth data line is electrically coupled to the main areas of the sub pixels of Nth column and provides a main data signal voltage to the same, and the corresponding Nth routing is led out from the voltage dividing unit, and is electrically coupled to the sub areas of the sub pixels of the next column, N−1 column and provides a sub data signal voltage acquired by performing voltage dividing to the main data signal voltage with the voltage dividing unit to the same. The polarities of the main data signal voltage provided by the Nth data signal line and the main data signal voltage provided by the next N+1th data signal line are opposite. It is capable of reducing the color shift issue of VA type liquid crystal display under the premise without increasing the amounts of the data signal lines and the COF ends, and meanwhile, capable of making that the main area and sub area in one sub pixel shows opposite polarities in one frame of an image to reduce the flicker of the liquid crystal display panel and promote the display quality.

BRIEF DESCRIPTION OF THE DRAWINGS

The technical solution and the beneficial effects of the present invention are best understood from the following detailed description with reference to the accompanying figures and embodiments.

In drawings.

DETAILED DESCRIPTION OF PREFERRED EMBODIMENTS

For better explaining the technical solution and the effect of the present invention, the present invention will be further described in detail with the accompanying drawings and the specific embodiments.

Figure 3:
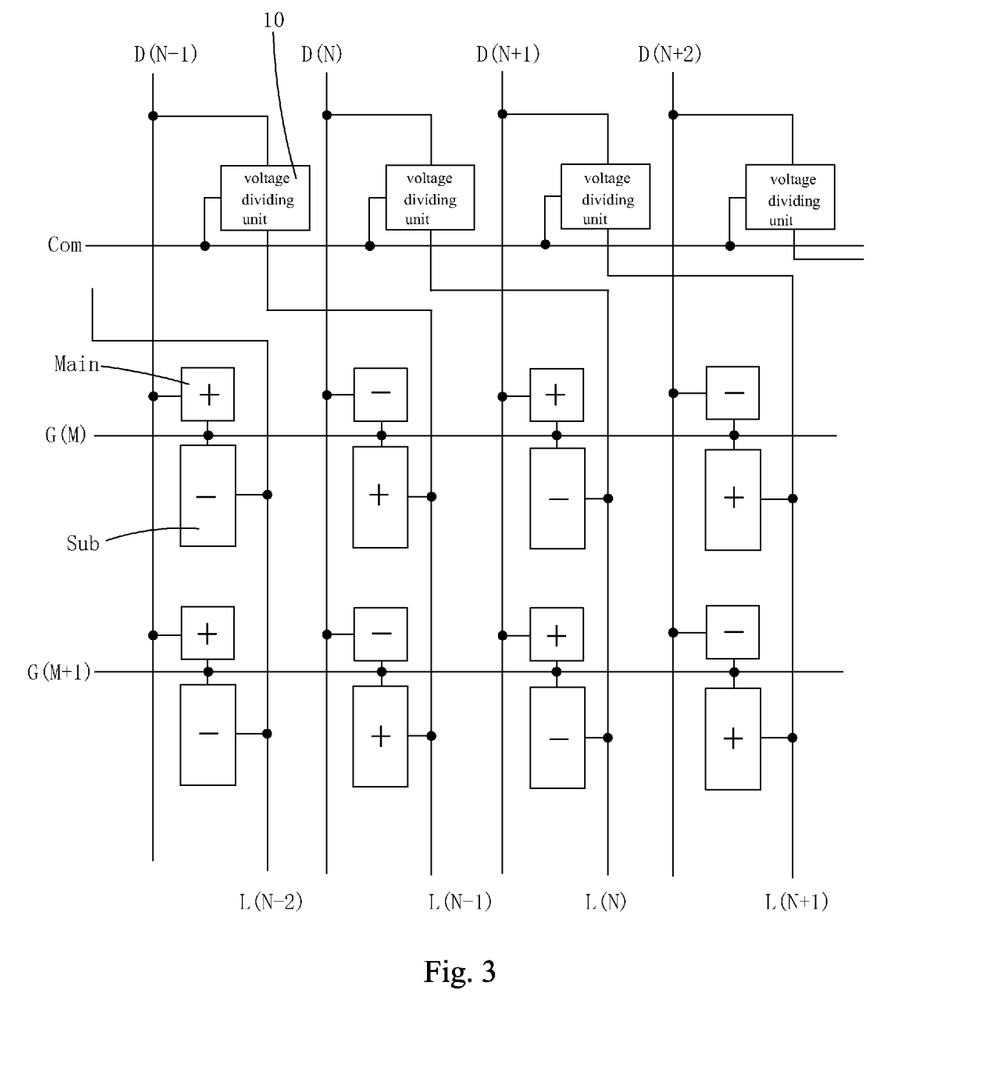
FIG. 3 is an overall structure diagram of a high quality liquid crystal display pixel circuit according to the present invention.
Figure 4:
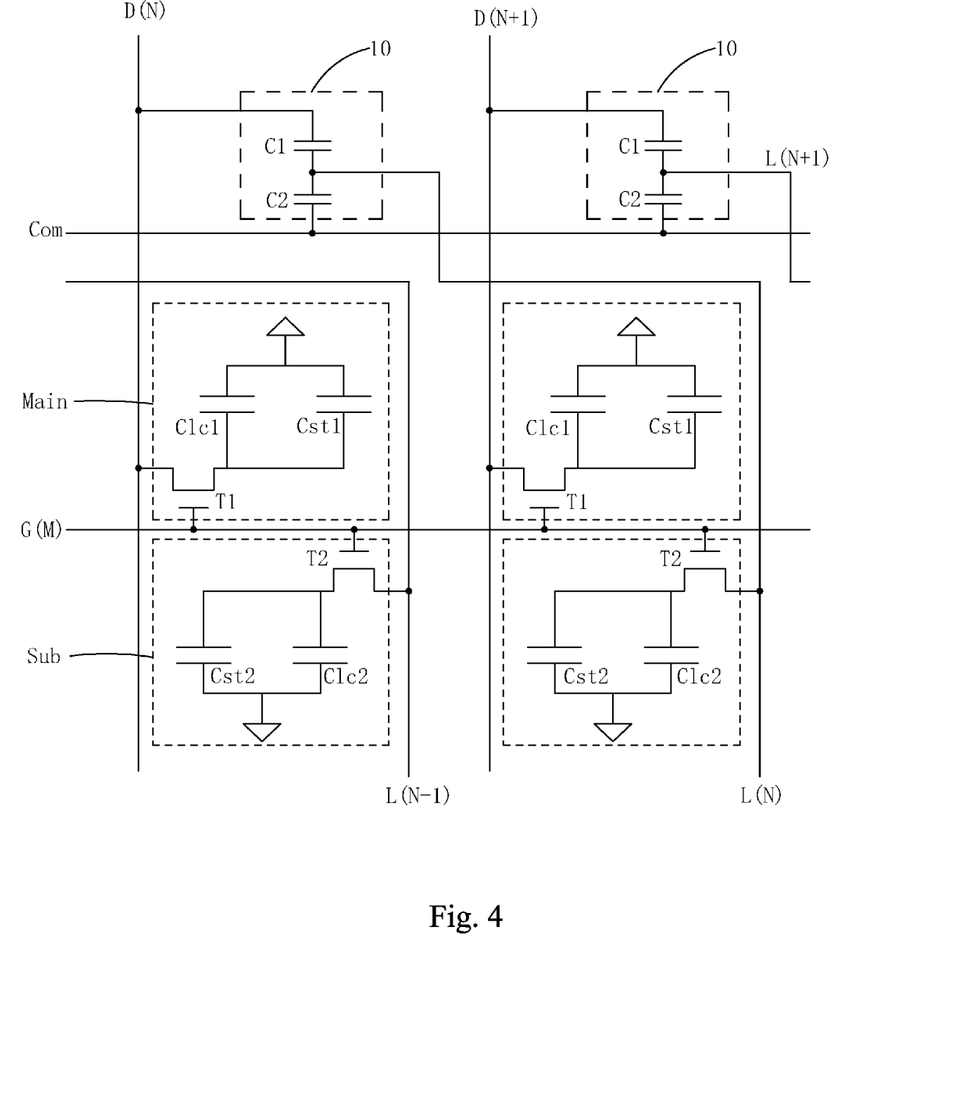
FIG. 4 is a specific circuit diagram in accordance with FIG. 3.

Please refer to FIG. 3 and FIG. 4. The present invention provides a high quality liquid crystal display pixel circuit, and a plurality of sub pixels arranged in array, and each sub pixel is divided into a main area Main and a sub area Sub; one scan line is provided in accordance with to sub pixels of each row, and one data signal line, a voltage dividing unit 10 and a wiring are provided in accordance with sub pixels of each column.

M, N are set to be positive integers, and a Mth scan line G(M) is electrically coupled to the main area Main and the sub area Sub of the sub pixels of Mth row at the same time and provides a scan signal to the same; a Nth data line D(N) is electrically coupled to the main areas Main of the sub pixels of Nth column and provides a main data signal voltage to the same, and the Nth data line D(N) is electrically coupled to the common electrode Com via the voltage dividing unit, and the corresponding Nth routing L(N) is led out from the voltage dividing unit 10, and is electrically coupled to the sub areas Sub of the sub pixels of the next N−1 column and provides a sub data signal voltage acquired by performing voltage dividing to the main data signal voltage with the voltage dividing unit to the same. That is to say, the first data signal line D(1) is electrically coupled to the main areas Main of the sub pixels of first column and provides the main data signal voltage to the same, and the corresponding first routing L(1) is led out from the voltage dividing unit 10, and is electrically coupled to the sub areas Sub of the sub pixels of second column and provides the sub data signal voltage acquired by performing voltage dividing to the main data signal voltage with the voltage dividing unit 10 to the same; the second data signal line D(2) is electrically coupled to the main areas Main of the sub pixels of second column and provides the main data signal voltage to the same, and the corresponding second routing L(2) is led out from the voltage dividing unit 10, and is electrically coupled to the sub areas Sub of the sub pixels of third column and provides the sub data signal voltage acquired by performing voltage dividing to the main data signal voltage with the voltage dividing unit 10 to the same; and so on.

Significantly, polarities of the main data signal voltages provided by two adjacent data signal lines are opposite. The polarity of the main data signal voltage provided by the Nth data signal line D(N) is set to be negative, and the polarities of the main data signal voltages provided by the N−1th data signal line D(N−1) and the N+1th data signal line D(N+1) are positive. For the sub pixels of Nth column, what the main area Main of each sub pixel receives is the main data signal voltage of negative polarity provided by the Nth data signal line D(N), and what the sub area Sub receives is the sub data signal voltage, of which the polarity is similarly positive, acquired by performing voltage dividing to the positive main data signal voltage provided by the N−1th data signal line D(N−1) with the voltage dividing unit 10; for the sub pixels of N+1th column, what the main area Main of each sub pixel receives is the main data signal voltage of positive polarity provided by the N+1th data signal line D(N−1), and what the sub area Sub receives is the sub data signal voltage, of which the polarity is similarly negative, acquired by performing voltage dividing to the negative main data signal voltage provided by the Nth data signal line D(N) with the voltage dividing unit 10. Thus it can be seen, the pixel circuit of the present invention is capable of achieving that the main area and sub area in one sub pixel shows opposite polarities in one frame of an image to reduce the flicker of the liquid crystal display panel and promote the display quality.

Specifically, the voltage dividing unit 10 comprises a first capacitor C1 and a second capacitor C2 coupled in series. One end of the first capacitor C1 is electrically coupled to the data signal line, and the other end is electrically coupled to one end of the second capacitor C2; the other end of the second capacitor C2 is electrically coupled to a common electrode line Com; the routing is led out between the first capacitor C1 and the second capacitor C2. The thin film transistor array substrate of the liquid crystal display panel comprises a first metal layer, a second metal layer and an Indium Tin Oxide (ITO) pixel electrode. The first capacitor C1 and the second capacitor C2 can be formed by a second metal layer and a first metal layer or by an ITO pixel electrode and the first metal layer. The specific structures and positions of the first metal layer, the second metal layer and the pixel electrodes are prior arts. No detail description is repeated. Sizes of the first capacitor C1 and the second capacitor C2 are respectively determined by areas of the first capacitor C1 and the second capacitor C2.

The main area Main comprises a first thin film transistor T1, a first liquid capacitor Clc1 and a first storage capacitor Cst1; the sub area Sub comprises a second thin film transistor T2, a second liquid capacitor Clc2 and a second storage capacitor Cst2.

For the sub pixel of Mth row, Nth column, a gate of the first thin film transistor T1 is electrically coupled to the Mth scan line G(M), and a source is electrically coupled to the Nth data signal line D(N); after the first liquid crystal capacitor Clcl and the first storage capacitor Cst1 are coupled in parallel, one end is electrically coupled to a drain of the first thin film transistor T1 and the other end is electrically coupled to a constant voltage; a gate of the second thin film transistor T2 is electrically coupled to the Mth scan line G(M), and a source is electrically coupled to the N−1th routing L(N−1) corresponding to the sub pixels of N−1th column; after the second liquid crystal capacitor Clc2 and the second storage capacitor Cst2 are coupled in parallel, one end is electrically coupled to a drain of the second thin film transistor T2 and the other end is electrically coupled to a constant voltage.

For the sub pixel of Mth row, N+1th column, a source of the first thin film transistor T1 is electrically coupled to the N+1th data signal line D(N+1); a source of the second thin film transistor T2 is electrically coupled to the Nth routing L(N) corresponding to the sub pixels of Nth column.

Furthermore, the main area Main and the sub area Sub respectively comprise multiple domains. For instance, the main area Main and the sub area Sub respectively comprise four domains. The Nth data signal line D(N) provides the main data signal voltage to the four domains in the main areas Main of the sub pixels of Nth column, and the Nth routing L(N) provides the sub data signal voltage to the four domains in the sub areas Sub of the sub pixels of the next N+1th column. With voltage dividing function of the first capacitor C1 and the second capacitor C2, the relationship of the main data signal voltage and the sub data signal voltage is:

$$V\text{sub}=(C1/(C1+C2))\times(V\text{main}-V\text{com})+V\text{com} \quad (1)$$

wherein Vsub represents the sub data signal voltage, and Vmain represents the main data signal voltage, and C1 represents the first capacitor, and C2 represents the second capacitor, and Vcom represents the common electrode voltage.

Thus it can be seen, the sub data signal voltage is different from the main data signal voltage, and the sub data signal voltage is closer to the common electrode voltage than the main data signal voltage, i.e. the voltage difference of the sub data signal voltage and the common electrode voltage is smaller than the voltage difference of the main data signal voltage and the common electrode voltage so that the voltages applied to the main areas Main of the sub pixels of Nth column and the sub areas Sub of the sub pixels of N+1th column are different for performing multi domain display and improving the color shift issue of VA type liquid crystal display to reduce the manufacture cost of the liquid crystal panel under the premise without increasing the amounts of the data signal lines and the COFs.

The sizes of the first capacitor C1 and the second capacitor C2 are respectively determined by areas of the first capacitor C1 and the second capacitor C2. According to the formula (1): the difference between the main data signal voltage and the sub data signal voltage is influenced by the sizes of the first capacitor C1 and the second capacitor C2. The data signal voltage difference between the main data signal voltage and the sub data signal voltage alters by changing areas of the first capacitor C1 and the second capacitor C2.

In conclusion, in the high quality liquid crystal display pixel circuit of the present invention, the Nth data line is electrically coupled to the main areas of the sub pixels of Nth column and provides a main data signal voltage to the same, and the corresponding Nth routing is led out from the voltage dividing unit, and is electrically coupled to the sub areas of the sub pixels of the next column, N−1 column and provides a sub data signal voltage acquired by performing voltage dividing to the main data signal voltage with the voltage dividing unit to the same. The polarities of the main data signal voltage provided by the Nth data signal line and the main data signal voltage provided by the next N+1th data signal line are opposite. It is capable of reducing the color shift issue of VA type liquid crystal display under the premise without increasing the amounts of the data signal lines and the COF ends, and meanwhile, capable of making that the main area and sub area in one sub pixel shows opposite polarities in one frame of an image to reduce the flicker of the liquid crystal display panel and promote the display quality.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. A high quality liquid crystal display pixel circuit, and a plurality of sub pixels arranged in an array, wherein: each sub pixel is divided into a main area and a sub area; one scan line is provided corresponding to sub pixels of each row; and one data signal line, a voltage dividing unit and a routing are provided corresponding to sub pixels of each column;

wherein M and N are set to be positive integers; a Mth scan line is electrically coupled to the main area and the sub area of the sub pixels of a Mth row at the same time and provides a scan signal to the Mth row; a Nth data line is electrically coupled to the main areas of the sub pixels of a Nth column and provides a main data signal voltage to the Nth column, and the Nth data line is electrically coupled to a common electrode via the voltage dividing unit, the corresponding Nth routing is led out from the voltage dividing unit, and is electrically coupled to the sub areas of the sub pixels of a next column, N+1 column, and provides a sub data signal voltage acquired by performing voltage dividing of the main data signal voltage with the corresponding voltage dividing unit to the same; and wherein polarities of the main data signal voltage provided by the Nth data signal line and the N+1th data signal line are opposite.

2. The high quality liquid crystal display pixel circuit according to claim 1, wherein the voltage dividing unit comprises a first capacitor and a second capacitor coupled in series, wherein one end of the first capacitor is electrically coupled to the data signal line and the other end is electrically coupled to one end of the second capacitor; and the other end of the second capacitor is electrically coupled to a common electrode line; and wherein the routing is led out between the first capacitor and the second capacitor.

3. The high quality liquid crystal display pixel circuit according to claim 1, wherein the main area comprises a first thin film transistor, a first liquid crystal capacitor and a first storage capacitor; and the sub area comprises a second thin film transistor, a second liquid crystal capacitor and a second storage capacitor;

wherein for the sub pixel of the Mth row and Nth column, a gate of the first thin film transistor is electrically coupled to the Mth scan line, and a source is electrically coupled to the Nth data signal line; the first liquid crystal capacitor and the first storage capacitor are coupled in parallel with one end thereof being electrically coupled to a drain of the first thin film transistor and the other end being electrically coupled to a constant voltage; a gate of the second thin film transistor is electrically coupled to the Mth scan line, and a source is electrically coupled to the N−1th routing corresponding to the sub pixels of a previous N−1th column; and the second liquid crystal capacitor and the second storage capacitor are coupled in parallel with one end thereof being electrically coupled to a drain of the second thin film transistor and the other end being electrically coupled to a constant voltage; and wherein for the sub pixel of Mth row and the N+1th column, a source of the first thin film transistor is electrically coupled to the N+1th data signal line; and a source of the second thin film transistor is electrically coupled to the Nth routing corresponding to the pixels of the Nth column.

4. The high quality liquid crystal display pixel circuit according to claim 2, wherein the main area and the sub area each comprise four domains.

5. The high quality liquid crystal display pixel circuit according to claim 4, wherein the Nth data signal line provides the main data signal voltage to the four domains of each of the main areas of the sub pixels of the Nth column, and the Nth routing provides the sub data signal voltage to the four domains of each of the sub areas of the sub pixels of the N+1th column; wherein with a voltage dividing function achieved with the first capacitor and the second capacitor, a relationship of the main data signal voltage and the sub data signal voltage is:

$$V\text{sub}=(C1/(C1+C2))\times(V\text{main}-V\text{com})+V\text{com}$$

wherein Vsub represents the sub data signal voltage, Vmain represents the main data signal voltage, C1 represents the first capacitor, C2 represents the second capacitor, and Vcom represents the common electrode voltage.

6. The high quality liquid crystal display pixel circuit according to claim 1, wherein the first capacitor and the second capacitor are formed by a second metal layer and a first metal layer.

7. The high quality liquid crystal display pixel circuit according to claim 1, wherein the first capacitor and the second capacitor are formed by an ITO pixel electrode and a first metal layer.

8. The high quality liquid crystal display pixel circuit according to claim 5, wherein sizes of the first capacitor and the second capacitor are respectively determined by areas of the first capacitor and the second capacitor.

9. The high quality liquid crystal display pixel circuit according to claim 8, wherein a difference between the main data signal voltage and the sub data signal voltage is changed by changing the areas of the first capacitor and the second capacitor.

10. A high quality liquid crystal display pixel circuit, and a plurality of sub pixels arranged in an array, wherein: each sub pixel is divided into a main area and a sub area; one scan line is provided corresponding to sub pixels of each row; and one data signal line, a voltage dividing unit and a routing are provided corresponding to sub pixels of each column;

wherein M and N are set to be positive integers; a Mth scan line is electrically coupled to the main area and the sub area of the sub pixels of a Mth row at the same time and provides a scan signal to the Mth row; a Nth data line is electrically coupled to the main areas of the sub pixels of a Nth column and provides a main data signal voltage to the Nth column, and the Nth data line is electrically coupled to a common electrode via the voltage dividing unit, the corresponding Nth routing is led out from the voltage dividing unit, and is electrically coupled to the sub areas of the sub pixels of a next column, N+1 column, and provides a sub data signal voltage acquired by performing voltage dividing of the main data signal voltage with the corresponding voltage dividing unit to the same;

wherein polarities of the main data signal voltage provided by the Nth data signal line and the N+1th data signal line are opposite;

wherein the voltage dividing unit comprises a first capacitor and a second capacitor coupled in series, wherein one end of the first capacitor is electrically coupled to the data signal line and the other end is electrically coupled to one end of the second capacitor; and the other end of the second capacitor is electrically coupled to a common electrode line; and wherein the routing is led out between the first capacitor and the second capacitor;

wherein the main area comprises a first thin film transistor, a first liquid crystal capacitor and a first storage capacitor; and the sub area comprises a second thin film transistor, a second liquid crystal capacitor and a second storage capacitor;

wherein for the sub pixel of the Mth row and Nth column, a gate of the first thin film transistor is electrically coupled to the Mth scan line, and a source is electrically coupled to the Nth data signal line; the first liquid crystal capacitor and the first storage capacitor are coupled in parallel with one end thereof being electrically coupled to a drain of the first thin film transistor and the other end being electrically coupled to a constant voltage; a gate of the second thin film transistor is electrically coupled to the Mth scan line, and a source is electrically coupled to the N−1th routing corresponding to the sub pixels of a previous N−1th column; and the second liquid crystal capacitor and the second storage capacitor are coupled in parallel with one end thereof being electrically coupled to a drain of the second thin film transistor and the other end being electrically coupled to a constant voltage; and wherein for the sub pixel of Mth row and the N+1th column, a source of the first thin film transistor is electrically coupled to the N+1th data signal line; and a source of the second thin film transistor is electrically coupled to the Nth routing corresponding to the pixels of the Nth column;

wherein the first capacitor and the second capacitor are formed by a second metal layer and a first metal layer.

11. The high quality liquid crystal display pixel circuit according to claim 10, wherein the main area and the sub area each comprise four domains.

12. The high quality liquid crystal display pixel circuit according to claim 11, wherein the Nth data signal line provides the main data signal voltage to the four domains of each of the main areas of the sub pixels of the Nth column, and the Nth routing provides the sub data signal voltage to the four domains of each of the sub areas of the sub pixels of the N+1th column; wherein with a voltage dividing function achieved with the first capacitor and the second capacitor, a relationship of the main data signal voltage and the sub data signal voltage is:

$$V\text{sub}=(C1/(C1+C2))\times(V\text{main}-V\text{com})+V\text{com}$$

wherein Vsub represents the sub data signal voltage, Vmain represents the main data signal voltage, C1 represents the first capacitor, C2 represents the second capacitor, and Vcom represents the common electrode voltage.

13. The high quality liquid crystal display pixel circuit according to claim 12, wherein sizes of the first capacitor and the second capacitor are respectively determined by areas of the first capacitor and the second capacitor.

14. The high quality liquid crystal display pixel circuit according to claim 13, wherein a difference between the main data signal voltage and the sub data signal voltage is changed by changing the areas of the first capacitor and the second capacitor.

* * * * *